US009431983B2

(12) United States Patent
Lin

(10) Patent No.: US 9,431,983 B2
(45) Date of Patent: Aug. 30, 2016

(54) VOLUME ADJUSTING METHOD, VOLUME ADJUSTING APPARATUS AND ELECTRONIC DEVICE USING THE SAME

(71) Applicant: TENCENT TECHOLOGY (SHENZHEN) COMPANY LIMITED, Shenzhen (CN)

(72) Inventor: Boke Lin, Shenzhen (CN)

(73) Assignee: TENCENT TECHNOLOGY (SHENZHEN) COMPANY LIMITED, Shenzhen (CN)

(*) Notice: Subject to any disclaimer, the term of this patent is extended or adjusted under 35 U.S.C. 154(b) by 140 days.

(21) Appl. No.: 14/256,737

(22) Filed: Apr. 18, 2014

(65) Prior Publication Data
US 2014/0369525 A1 Dec. 18, 2014

Related U.S. Application Data

(63) Continuation of application No. PCT/CN2014/070262, filed on Jan. 7, 2014.

(30) Foreign Application Priority Data

Jun. 17, 2013 (CN) .......................... 2013 1 0239843

(51) Int. Cl.
H03G 3/30 (2006.01)

(52) U.S. Cl.
CPC .......... H03G 3/3089 (2013.01); H03G 3/3005 (2013.01)

(58) Field of Classification Search
CPC .................................................. H03G 3/3089
See application file for complete search history.

(56) References Cited

U.S. PATENT DOCUMENTS

2006/0291666 A1* 12/2006 Ball ..................... H04R 29/008
381/58
2007/0240074 A1* 10/2007 Banks ................. G06F 3/04847
715/771

(Continued)

FOREIGN PATENT DOCUMENTS

CN 102455888 5/2012
CN 102545812 7/2012

(Continued)

OTHER PUBLICATIONS

Shanghai Pateo Yuezhen Elect, English translation of CN102545812, Jul. 4, 2012, whole document.*

(Continued)

Primary Examiner — Sonia Gay
(74) Attorney, Agent, or Firm — Vierra Magen Marcus LLP

(57) ABSTRACT

A method, an apparatus for adjusting volume and an electronic device using the same is provided. The method comprises: receiving a volume adjusting signal; detecting a current application scene based on a display content of the electronic device after receiving the volume adjusting signal; displaying a volume adjusting interface, the volume adjusting interface including an volume adjusting area which corresponds to the detected current application scene and a selecting area for indicating whether the volume adjusting signal is applied to all application scenes of the electronic device; adjusting volume based on the volume adjusting signal and applying the adjusted volume to the detected current application scene in case that a selected state of the selecting area is in a first state or applying the adjusted volume to all application scenes of the electronic device in case that the selected state of the selecting area is in a second state.

11 Claims, 6 Drawing Sheets

(56) References Cited

U.S. PATENT DOCUMENTS

| | | | |
|---|---|---|---|
| 2012/0110452 A1 | 5/2012 | Hiipakka | |
| 2014/0082496 A1* | 3/2014 | Jung | H03G 3/002 715/716 |
| 2014/0109003 A1* | 4/2014 | Saib | G06F 3/0482 715/808 |
| 2015/0253936 A1* | 9/2015 | Marra | G06F 3/0481 715/716 |

FOREIGN PATENT DOCUMENTS

| | | | |
|---|---|---|---|
| CN | 102750154 | 10/2012 | |
| JP | 2006157082 A * | 6/2006 | H04M 1/00 |

OTHER PUBLICATIONS

PCT International Search Report dated Mar. 22, 2014, PCT Patent Application No. PCT/CN2014/070262.
PCT Written Opinion of the International Searching Authority dated Mar. 22, 2014, PCT Patent Application No. PCT/CN2014/070262.
English Translation of Abstract of Chinese Patent Application CN102545812.
English Translation of Abstract of Chinese Patent Application CN102455888.
English Translation of Abstract of Chinese Patent Application CN102750154.

* cited by examiner

VOLUME ADJUSTING METHOD, VOLUME ADJUSTING APPARATUS AND ELECTRONIC DEVICE USING THE SAME

CROSS REFERENCE TO RELATED APPLICATIONS

This application is a continuation application of PCT Patent Application No. PCT/CN2014/070262, entitled "VOLUME ADJUSTING METHOD, VOLUME ADJUSTING APPARATUS AND ELECTRONIC DEVICE USING THE SAME" filed on Jan. 7, 2014, which claims priority to a Chinese Patent Application No. 201310239843.2, entitled "VOLUME ADJUSTING METHOD, VOLUME ADJUSTING APPARATUS AND ELECTRONIC DEVICE USING THE SAME" filed on Jun. 17, 2013, both of which are incorporated by reference in their entirety.

TECHNICAL FIELD

The present disclosure relates to the field of mobile internet terminal, in particular, to a volume adjusting method, volume adjusting apparatus and electronic device using the same.

BACKGROUND ART

The function of adjusting the sound volume is the one used most frequently in an electronic device such as smart cell phone, tablet computer, electronic book reader or the like.

Generally, the present electronic device is provided with a physical volume adjusting key (also referred to as Hard Key). In most of electronic devices, a user uses the physical volume adjusting key to adjust the volume, which may cause the global volume of the device to be changed. Taking a smart cell phone as an example of the electronic device, when the user uses the physical volume adjusting key to reduce the volume in a music playing interface, the volume adjusting result will be applied to the functions such as ringing tone, system alerting tone, alarm clock and so on.

SUMMARY OF INVENTION

The disclosure provides a method, an apparatus and an electronic device for adjusting volume. The technical solutions are as follows.

According to an aspect of the present disclosure, a volume adjusting method used in an electronic device comprises: receiving a first volume adjusting signal; detecting a current application scene based on a display content of the electronic device after receiving the volume adjusting signal; displaying a first volume adjusting interface, the first volume adjusting interface including an volume adjusting area which corresponds to the detected current application scene and a selecting area for indicating whether the volume adjusting signal is applied to all the application scenes of the electronic device; and adjusting volume based on the volume adjusting signal and applying the adjusted volume to the detected current application scene in case that a selected state of the selecting area is in a first state that the volume adjusting signal is not applied to all the application scenes of the electronic device or adjusting volume based on the volume adjusting signal and applying the adjusted volume to all the application scenes of the electronic device in case that a selected state of the selecting area is in a second state that the volume adjusting signal is applied to all the application scenes of the electronic device.

According to another aspect of the present disclosure, a volume adjusting apparatus in an electronic device comprises: a signal receiving module configured to receive a first volume adjusting signal; a scene detecting module configured to detect a current application scene based on a display content of the electronic device after signal receiving module receiving the volume adjusting signal; a first display module configured to display a first volume adjusting interface, the first volume adjusting interface including an volume adjusting area which corresponds to the detected current application scene and a selecting area for indicating whether the volume adjusting signal is applied to all the application scenes of the electronic device; a local applying module configured to adjust volume based on the volume adjusting signal and apply the adjusted volume to the detected current application scene in case that a selected state of the selecting area is in a first state that the volume adjusting signal is not applied to all the application scenes of the electronic device; and a global applying module configured to adjust volume based on the volume adjusting signal and apply the adjusted volume to all the application scenes of the electronic device in case that a selected state of the selecting area is in a second state that the volume adjusting signal is applied to all the application scenes of the electronic device.

According to a still aspect of the present disclosure, an electronic device includes the volume adjusting apparatus mentioned above.

According to a still aspect of the present disclosure, a non-transitory computer-readable storage medium comprises a set of instructions for directing at least one processor to perform acts of the method for adjusting volume mentioned above.

With the configuration mentioned above, the problem that the existing volume adjusting method can adjust only the global volumes simultaneously is solved by displaying a first volume adjusting interface including an volume adjusting area corresponding to the current application scene and a selecting area and determining whether the adjusted volume is applied to all the application scenes or only the current application scene based on the selected state of the selecting area. Further, with the configuration mentioned above, automatically identifying the current application scene and selectively adjusting the volume of only the current application scene or all the application scenes simultaneously can be achieved.

BRIEF DESCRIPTION OF THE DRAWINGS

In order to describe the embodiments of the present disclosure more clearly, a brief description on the drawings which are referred to in describing the present disclosure will be made below. Apparently, the drawings described below are only some embodiments of the disclosure and other drawings can be conceived based on the described drawings by the person skilled in the art without paying any inventive effort.

DETAILED DESCRIPTION

In order to make the technical solution and advantages of the disclosure more apparent, a more detailed description of the disclosure will be given below in conjunction with the embodiments and the accompanying drawings.

Generally, the "terminal" mentioned in the context may be an electronic device with a touch screen, in particular, may be a smart cell phone, tablet computer, electronic book reader, MP3 player, MP4 player, portable laptop computer and so on.

Figure 1:
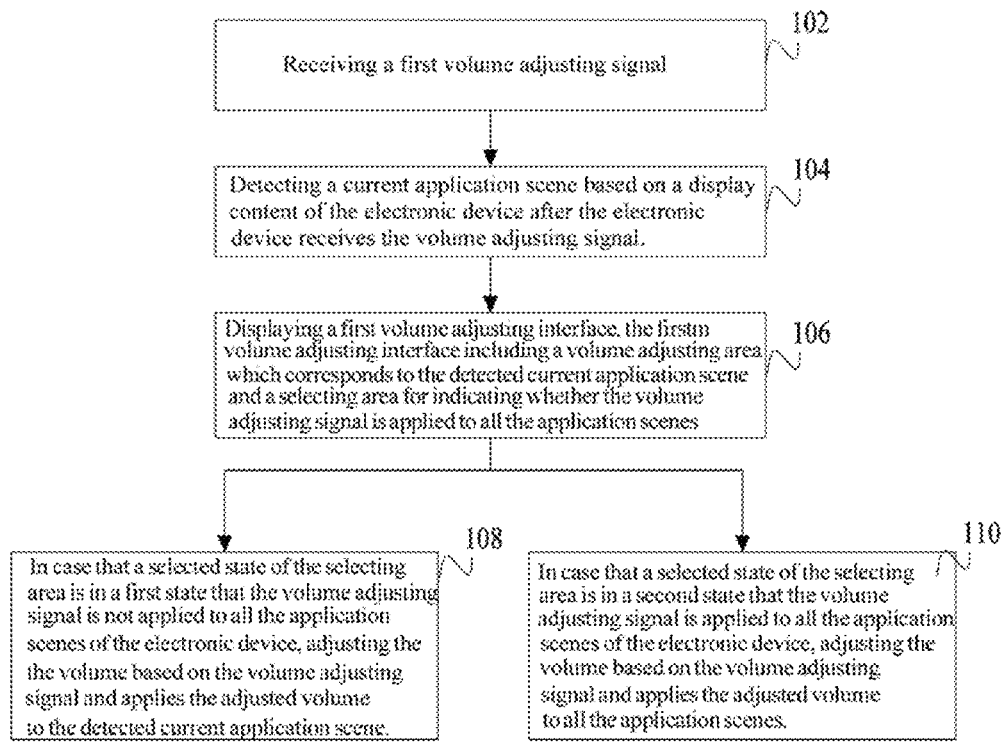
FIG. 1 is a flow chart of a volume adjusting method according to a first embodiment of the present disclosure.

FIG. 1 is a flow chart of a volume adjusting method according to a first embodiment of the present disclosure.

As shown in FIG. 1, the embodiment is mainly illustrated by taking the volume adjusting method implemented in an electronic device as an example. Generally, the volume adjusting method includes the following steps.

At step S102, a first volume adjusting signal is received by the electronic device. At step S104, a current application scene is detected based on a display content of the electronic device after the electronic device receives the volume adjusting signal. At step S106, the electronic device displays a first volume adjusting interface, the first volume adjusting interface including a volume adjusting area which corresponds to the detected current application scene and a selecting area for indicating whether the volume adjusting signal is applied to all the application scenes of the electronic device. At step S108, in case that a selected state of the selecting area is in a first state that the volume adjusting signal is not applied to all the application scenes of the electronic device, the electronic device adjusts the volume based on the volume adjusting signal and applies the adjusted volume to the detected current application scene. Otherwise, at step 110, in case that a selected state of the selecting area is in a second state that the volume adjusting signal is applied to all the application scenes of the electronic device, the electronic device adjusts volume based on the volume adjusting signal and applies the adjusted volume to all the application scenes of the electronic device.

With the configuration mentioned above, the problem that the existing volume adjusting method can adjust only the global volumes is solved by displaying a first volume adjusting interface including an volume adjusting area corresponding to the current application scene and a selecting area and determining whether the adjusted volume is applied to all the application scenes or only the current application scene based on the selected state of the selecting area. Further, with the configuration mentioned above, automatically identifying the current application scene and selectively adjusting the volume of only the current application scene or all the application scenes simultaneously can be achieved.

Figure 2A:
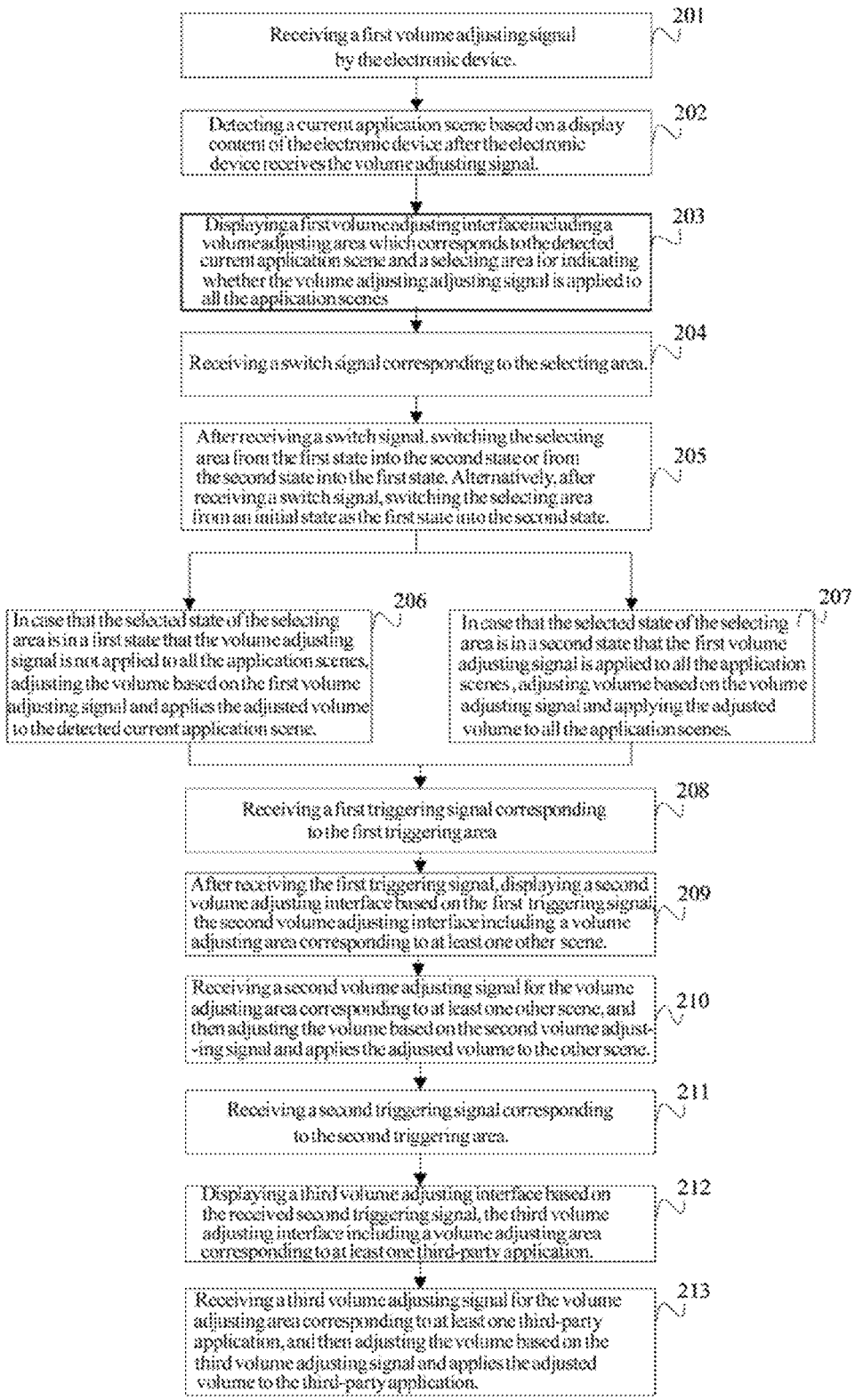
FIG. 2A is a flow chart of a volume adjusting method according to a second embodiment of the present disclosure.

FIG. 2A is a flow chart of a volume adjusting method according to a second embodiment of the present disclosure. FIG. 2B-2H is schematic diagrams that show the operation interfaces of the adjusting volume method according to the second embodiment of the present disclosure.

As shown in FIG. 2A, it shows a flow chart of a volume adjusting method according to a second embodiment of the present disclosure. The embodiment is mainly illustrated by taking the volume adjusting method implemented in an electronic device as an example. Specifically, the electronic device may be a smart phone in the present embodiment. The volume adjusting method may be implemented by the following steps.

Figure 2B:
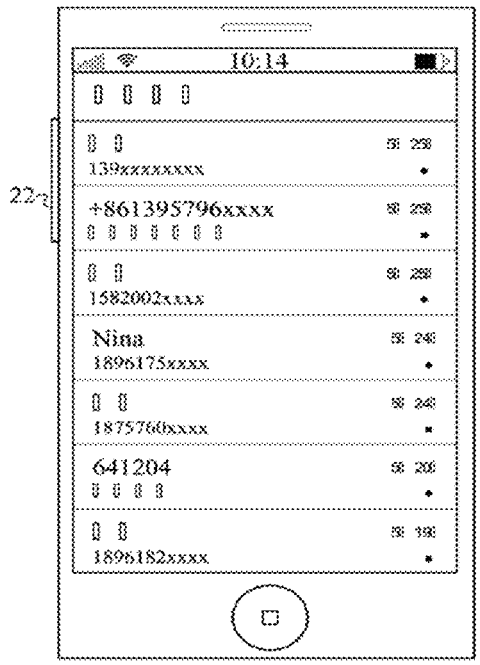
FIG. 2B-2H is schematic diagrams that show the operation interfaces of the adjusting volume method according to the second embodiment of the present disclosure.

At step S201, a first volume adjusting signal is received by the electronic device. When a user operates a smart phone, a first volume adjusting signal may be triggered by a physical volume key provided in the smart phone. Referring to FIG. 2B, the smart phone 20 can receive a volume adjusting signal by means of a physical volume adjusting key 22. Specifically, when the upper portion of the physical volume adjusting key 22 is pressed by the user, the smart phone 20 receives a volume adjusting signal for increasing the volume. When the lower portion of the physical volume adjusting key 22 is pressed by the user, the smart phone 20 receives a volume adjusting signal for decreasing the volume.

At step S202, a current application scene is detected based on a display content of the electronic device after the electronic device receives the volume adjusting signal. After receiving the volume adjusting signal, the smart phone detects a current application scene based on a currently displayed content. Specifically, the smart phone may know the currently displayed content through an Application Programming Interface (API) provided by the Operation System (OS) so that a current application scene can be known based on the a corresponding relationship between a display content and an application scene which is stored in advance. The application scene may be standby scene, calling scene, short-message scene, multimedia playing scene, alarming scene and other application scene corresponding to a third-party application. Taking FIG. 2B as an example, the smart phone knows that the current application scene is a calling scene when knowing that the currently displayed content is a calling record interface.

At step S203, the electronic device displays a first volume adjusting interface, the first volume adjusting interface including a volume adjusting area which corresponds to the detected current application scene and a selecting area for indicating whether the volume adjusting signal is applied to all the application scenes of the electronic device. After detecting the current application scene, the smart phone displays the first volume adjusting interface, the first volume adjusting interface including the volume adjusting area which corresponds to the detected current application scene and the selecting area for indicating whether the volume adjusting signal is applied to all the application scenes of the electronic device. The "interface" as described in the present description may be all the content occupying the whole screen or some of the windows or displayed contents, which are dependent on different embodiments.

Figure 2C:
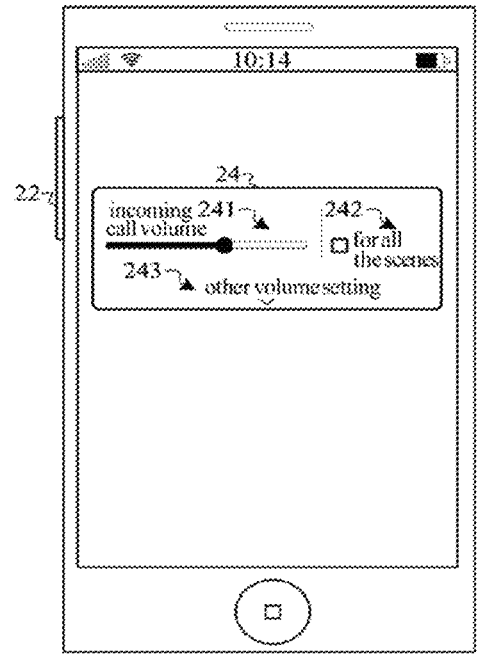

Referring to FIG. 2C, after detecting the current application scene, the smart phone displays the first volume adjusting interface 24. The first volume adjusting interface 24 includes the volume adjusting area 241 which corresponds to the detected current application scene and the selecting area 242 for indicating whether the volume adjusting signal is applied to all the application scenes of the electronic device. In the present embodiment, the volume adjusting area 241 is illustrated as a volume adjusting bar and the selecting area 242 is illustrated as a check-box.

Figure 2D:
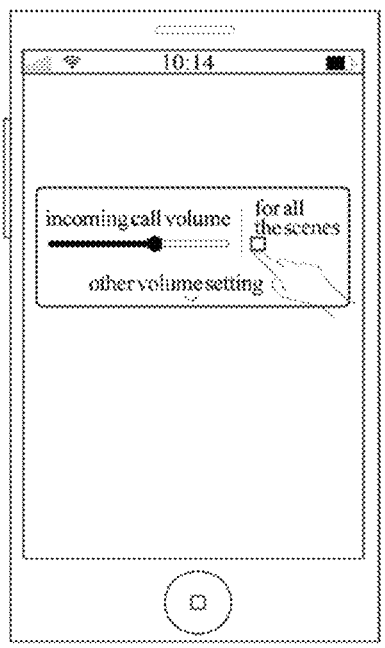

At step S204, a switch signal corresponding to the selecting area is received. The selecting area 242 may be in any one of two different states. In the present embodiment, the default of the selecting area 242 is in a first state that the volume adjusting signal is not applied to all the application scenes of the electronic device, that is, the check-box as shown is not checked. Alternatively, in other embodiments, the default of the selecting area 242 is in a second state that the volume adjusting signal is applied to all the application scenes of the electronic device, that is, the check-box as shown is checked. Based on the user's adjusting requirements, the selecting area 242 may be switched between the first state and the second state. At this time, the smart phone may receive a switch signal corresponding to the selecting area. Referring to FIG. 2D, the switch signal may be a click signal applied to the selecting area.

At step S205, after receiving a switch signal, the selecting area may be switched from the first state into the second state or from the second state into the first state. After receiving a switch signal, the smart phone can switch the selecting area from an initial state as the first state into the second state. Preferably, after the state of the selecting area is switched from the first state into the second state, a prompt message is presented. The prompt message is for prompting that the adjusted volume will be applied to all the application scenes. For an example, the prompt message may be a pop-up box occurring near the check-box. In the pop-up box, there is a textual message "when this function is enabled, the volume adjusting with respect to the calling volume is applied to other application scenes simultaneously". Such prompt information is displayed for a predetermined number of seconds and then fades automatically.

Alternatively, if the initial state is the second state, the smart phone may switch the selecting area from the initial state as the second state into the first state. It shall be noted that, steps S204 and S205 are not a necessary step but an optional step dependent on the user's requirements.

At step S206, in case that the selected state of the selecting area is in a first state that the volume adjusting signal is not applied to all the application scenes of the electronic device, the electronic device adjusts the volume based on the first volume adjusting signal and applies the adjusted volume to the detected current application scene. If the selected state of the selecting area is in a first state that the volume adjusting signal is not applied to all the application scenes of the electronic device, the smart phone adjusts the volume based on the first volume adjusting signal and applies the adjusted volume to the detected current application scene. In other words, if the check-box in the selecting area as shown in FIG. 2D is not checked, the smart phone adjusts the volume based on the first volume adjusting signal and only applies the adjusted volume to the detected current application scene. For an example, the adjusted volume is applied to only the calling scene and the volume of other application scenes maintains its initial setting.

It shall be noted that, the first volume adjusting signal may be the one received in step S201 or a plurality of volume adjusting signals received before the step S205.

Alternatively, at step S207, in case that the selected state of the selecting area is in a second state that the first volume adjusting signal is applied to all the application scenes of the electronic device, the electronic device adjusts volume based on the volume adjusting signal and applies the adjusted volume to all the application scenes of the electronic device. If the selected state of the selecting area is in the second state that the volume adjusting signal is applied to all the application scenes of the electronic device, the smart phone adjusts the volume based on the first volume adjusting signal and applies the adjusted volume to all the application scenes. In other words, if the check-box in the selecting area as shown in FIG. 2D is checked, the smart phone adjusts the volume based on the first volume adjusting signal and applies the adjusted volume to all the application scenes. For example, the adjusted volume is applied to not only the calling scene but also the other application scenes.

It shall be noted that, the first volume adjusting signal may be the one received in step S201 or a plurality of volume adjusting signals received before the step S205.

At step S208, a first triggering signal corresponding to the first triggering area is received. In general, the existing volume adjusting interfaces are hided in a deeper layer of a system setting. To improve the efficiency of adjusting volume and make the volume adjusting with respect to other application scenes more easily, the first volume adjusting interface 24 according to the present embodiment includes a first triggering area 243. Referring to FIG. 2C, the first triggering area may be a press button 243. When the user wants to adjust the volume of other application scenes, the smart phone may receive a first triggering signal applied to the first triggering area 243. The first triggering signal may be a click signal applied to the first triggering area 243.

Figure 2E:
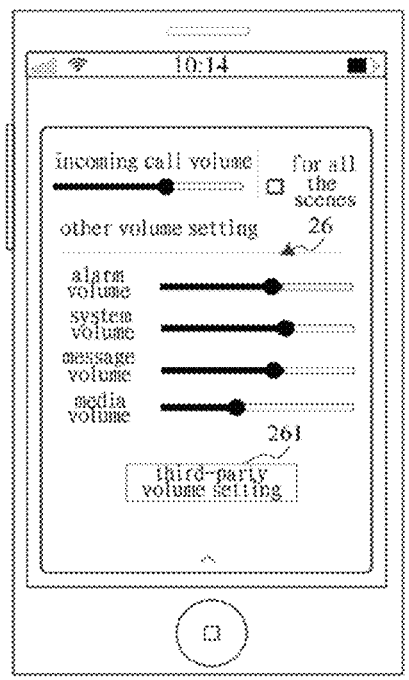

At step S209, after receiving the first triggering signal, the electronic device displays a second volume adjusting interface based on the received first triggering signal, the second volume adjusting interface including a volume adjusting area corresponding to at least one other application scene. Specifically, the smart phone displays the second volume adjusting interface after receiving the first triggering signal, the second volume adjusting interface including a volume adjusting area corresponding to at least one other application scene. Referring to FIG. 2E, the second volume adjusting interface 26 may coexist with the first volume adjusting interface 24. In the present embodiment, the second volume adjusting interface 26 may be a volume adjusting area corresponding to four application scenes such as alarming scene, system scene, short message scene and multimedia scene. That is, as shown, four volume adjusting bars respectively corresponding to alarming volume, system volume, short message volume and multimedia volume are illustrated as the examples of the other application scenes. However, in other different embodiments, the combination of the other application scenes may be different and the example as shown is not limited to the present disclosure.

It shall be noted that, when the selected state of the selecting area 242 is in the second state, the adjusted volume will be applied to all the application scenes. In this case, when displaying the second volume adjusting interface, the smart phone shall perform the following steps. Firstly, the smart phone shall determine whether the selected state of the selecting area is in the second state. That is, the smart phone determines whether the selected state of the selecting area is in the second state indicating that the adjusted volume is applied to all the application scenes. Secondly, in case that the selected state of the selecting area is in the second state, the second volume adjusting interface is set in an uneditable state. Specifically, if the smart phone determines that the selected state of the selecting area 242 is in the second state, the second volume adjusting interface 26 is set in the uneditable state. In the uneditable state, all the elements related to the volume in the second volume adjusting interface 26 cannot be edited. For example, the volume adjusting bars and other buttons in the second volume adjusting interface 26 cannot be edited. Thirdly, in case that the selected state of the selecting area is in the first state, the second volume adjusting interface 26 is set in an editable state. Specifically, if the smart phone determines that the selected state of the selecting area 242 is in the first state, the second volume adjusting interface 26 is set in the editable state.

Figure 2F:
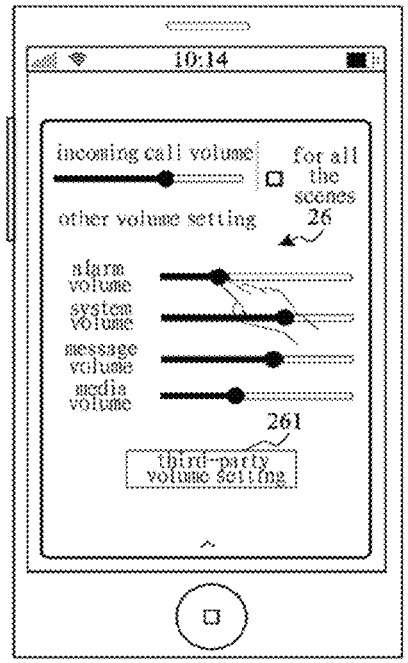

At step S210, the electronic device receives a second volume adjusting signal for the volume adjusting area corresponding to at least one other application scene, and then adjusts the volume based on the second volume adjusting signal and applies the adjusted volume to the other application scenes. In the editable state of the second volume adjusting interface 26, the smart phone receives a second volume adjusting signal for the volume adjusting area corresponding to at least one other application scene, and then adjusts the volume based on the second volume adjusting signal and applies the adjusted volume to the other application scenes. Referring to FIG. 2F, the second volume adjusting signal may be a touch signal applied to the alarming volume. The smart phone adjusts the alarming volume based on the second volume adjusting signal and applies the adjusted volume to the alarming scene.

If the second volume adjusting interface 26 is in the uneditable state, the smart phone issues an error prompt even if the smart phone receives a second volume adjusting signal. The error prompt may be a motion picture causing the second volume adjusting interface 26 flutters.

Figure 2G:
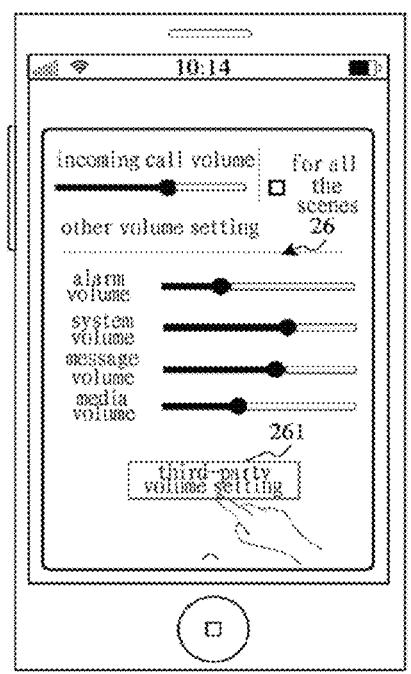

At step S211, the electronic device receives a second triggering signal corresponding to the second triggering area. In general, the user may install a variety of third-party applications in the electronic device. In order to improve the efficiency of adjusting volume so as to facilitate the volume adjusting with respect to the third-party application, the second volume adjusting interface 26 further includes a second triggering area 261. With reference to FIG. 2G, the second triggering area 261 may be a press button. When the user wants to adjust the volume of the application scene corresponding to the third-party application, the smart phone may receive the second triggering signal applied to the second triggering area. The second triggering signal may be a click signal applied to the press button 261.

It shall be noted that the second triggering area 261 cannot be edited when the second volume adjusting interface 26 is in an uneditable state.

Figure 2H:
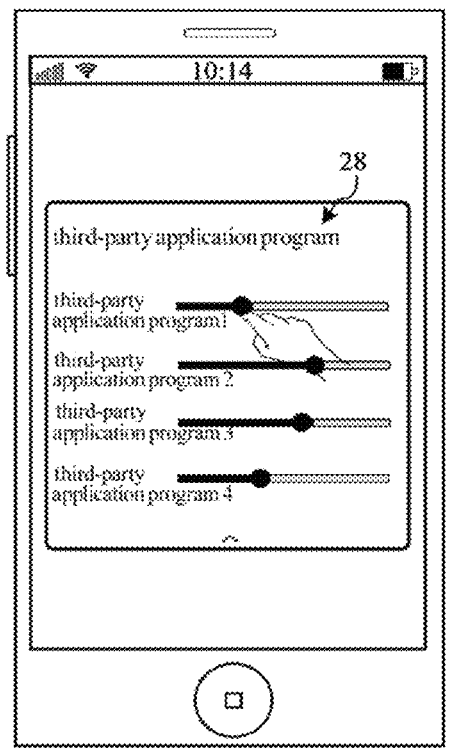

At step S212, the electronic device displays a third volume adjusting interface based on the received second triggering signal, the third volume adjusting interface including a volume adjusting area corresponding to at least one third-party application. Specifically, the smart phone displays a third volume adjusting interface based on the received second triggering signal, the third volume adjusting interface including a volume adjusting area corresponding to at least one third-party application. With reference to FIG. 2H, the third volume adjusting interface 28 may be displayed alone. In the present embodiment, the third volume adjusting interface 28 may include a volume adjusting area corresponding to a plurality of third-party applications and the number of the installed third-party applications may be dependent on the user requirements.

At step S213, the electronic device receives a third volume adjusting signal for the volume adjusting area corresponding to at least one third-party application, and then adjusts the volume based on the third volume adjusting signal and applies the adjusted volume to the third-party application. Specifically, the smart phone receives a third volume adjusting signal for the volume adjusting area corresponding to at least one third-party application, and then adjusts the volume based on the third volume adjusting signal and applies the adjusted volume to the third-party application. With reference to FIG. 2H, the third volume adjusting signal may be a touch signal applied to a volume adjusting bar of "the third-party application program 1". The smart phone can adjust the volume of "the third-party application program 1" based on the third volume adjusting signal and apply the adjusted volume to the application scene of "the third-party application program 1".

With the configuration mentioned above, the problem that the existing volume adjusting method can adjust only the global volumes is solved by displaying a first volume adjusting interface including an volume adjusting area corresponding to the current application scene and a selecting area and determining whether the adjusted volume is applied to all the application scenes or only the current application scene based on the selected state of the selecting area. Further, with the configuration mentioned above, automatically identifying the current application scene and selectively adjusting the volume of only the current application scene or all the application scenes simultaneously can be achieved.

In addition, the method according to the present disclosure can selectively adjust the volume of both other application scene and an application scene of a third-party application simultaneously by providing the second volume adjusting interface and/or the third volume adjusting interface, so as to obtain an effect of adjusting the volume of different application scenes conveniently and promptly by several simple operation steps.

The following description is made with respect to the apparatus embodiments of the present disclosure. If any portion is not mentioned therein, the method embodiments above can be referred to.

Figure 3:
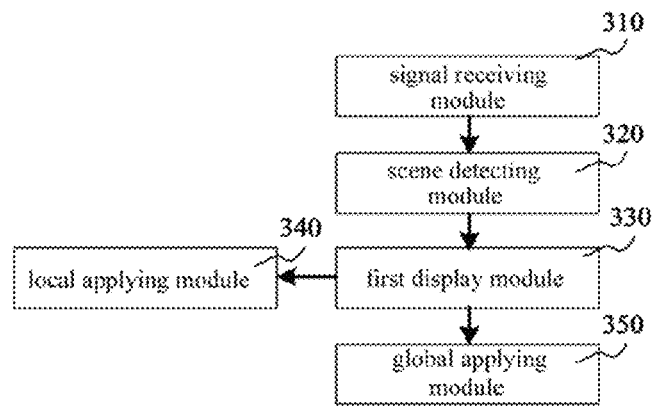
FIG. 3 is a structural block diagram that shows a volume adjusting apparatus according to a third embodiment of the present disclosure.

FIG. 3 is a structural block diagram that shows a volume adjusting apparatus according to a third embodiment of the present disclosure.

As shown in FIG. 3, it is a structural block diagram that shows a volume adjusting apparatus according to the third embodiment of the present disclosure. All or some of the embodiments of the volume adjusting apparatus may be implemented by software, hardware or combination thereof. The volume adjusting apparatus comprises a signal receiving module 310, a scene detecting module 320, a first display module 330, a local applying module 340 and a global applying module 350.

The signal receiving module 310 is configured to receive a first volume adjusting signal.

The scene detecting module 320 is configured to detect a current application scene based on a display content of the electronic device after the signal receiving module 310 receiving the volume adjusting signal.

The first display module 330 is configured to display a first volume adjusting interface, the first volume adjusting interface including a volume adjusting area which corresponds to the detected current application scene and a selecting area for indicating whether the volume adjusting signal is applied to all the application scenes of the electronic device.

The local applying module 340 is configured to adjust volume based on the volume adjusting signal and apply the adjusted volume to the detected current application scene in case that a selected state of the selecting area displayed in the first display module 330 is in a first state that the volume adjusting signal is not applied to all the application scenes of the electronic device.

The global applying module 350 is configured to adjust volume based on the volume adjusting signal and apply the adjusted volume to all the application scenes of the electronic device in case that a selected state of the selecting area displayed in the first display module 330 is in a second state that the volume adjusting signal is applied to all the application scenes of the electronic device.

With the configuration of the volume adjusting apparatus mentioned above, the problem that the existing volume adjusting method can adjust only the global volumes is solved by displaying a first volume adjusting interface including an volume adjusting area corresponding to the current application scene and a selecting area and determining whether the adjusted volume is applied to all the application scenes or only the current application scene based on the selected state of the selecting area. Further, with the configuration mentioned above, automatically identifying the current application scene and selectively adjusting the volume of only the current application scene or all the application scenes simultaneously can be achieved.

Figure 4:
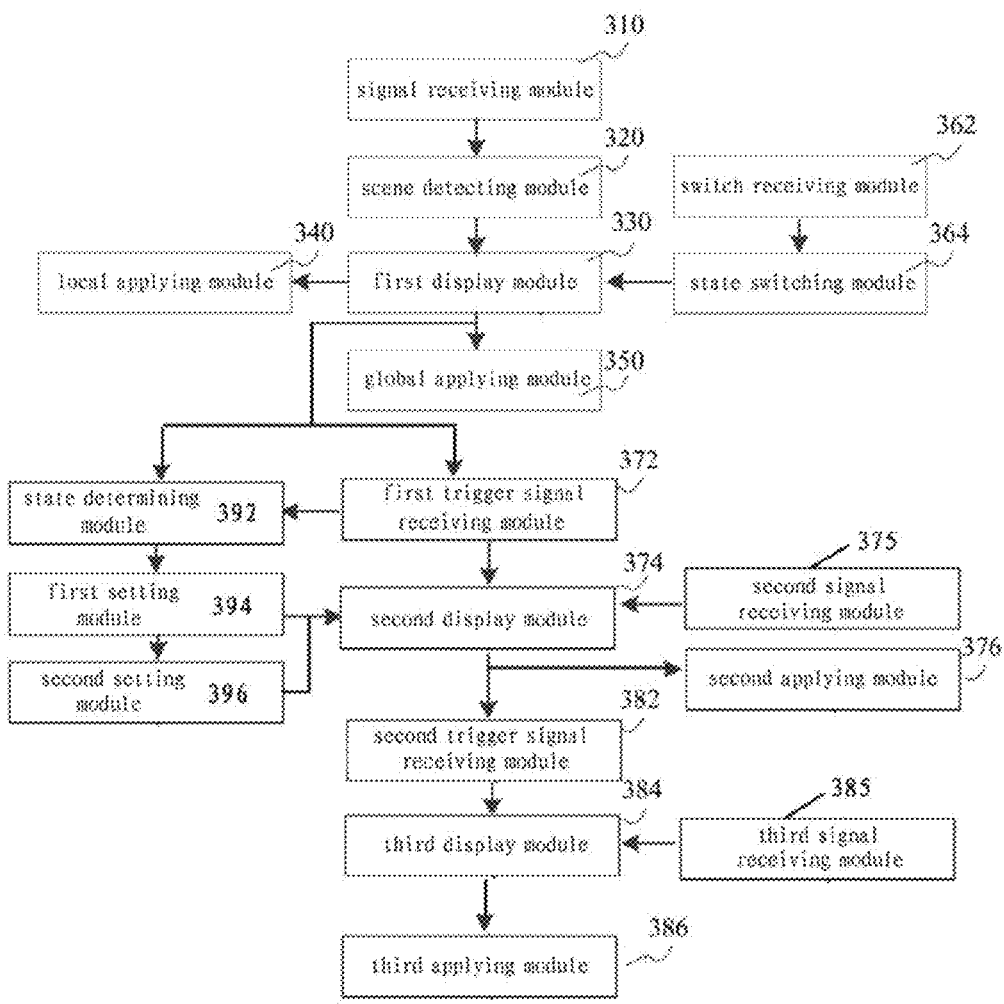
FIG. 4 is a structural block diagram that shows a volume adjusting apparatus according to a fourth embodiment of the present disclosure.

FIG. 4 is a structural block diagram that shows a volume adjusting apparatus according to a fourth embodiment of the present disclosure.

As shown in FIG. 4, it is a structural block diagram that shows a volume adjusting apparatus according to the fourth embodiment of the present disclosure. All or some of the embodiments of the volume adjusting apparatus may be implemented by software, hardware or combination thereof. The volume adjusting apparatus comprises a signal receiving module 310, a scene detecting module 320, a first display module 330, a local applying module 340 and a global applying module 350.

The signal receiving module 310 is configured to receive a first volume adjusting signal.

The scene detecting module 320 is configured to detect a current application scene based on a display content of the electronic device after signal receiving module 310 receiving the volume adjusting signal.

The first display module 330 is configured to display a first volume adjusting interface, the first volume adjusting interface including a volume adjusting area which corresponds to the detected current application scene and a selecting area for indicating whether the volume adjusting signal is applied to all the application scenes of the electronic device.

The local applying module 340 is configured to adjust volume based on the volume adjusting signal and apply the adjusted volume to the detected current application scene in case that a selected state of the selecting area displayed in the first display module 330 is in a first state that the volume adjusting signal is not applied to all the application scenes of the electronic device.

The global applying module 350 is configured to adjust volume based on the volume adjusting signal and apply the adjusted volume to all the application scenes of the electronic device in case that a selected state of the selecting area displayed in the first display module 330 is in a second state that the volume adjusting signal is applied to all the application scenes of the electronic device.

According to an embodiment of the present disclosure, the volume adjusting apparatus further comprises a switch receiving module 362 and a state switching module 364. The switch receiving module 362 is configured to receive a switch signal corresponding to the selecting area. The state switching module 364 is configured to switch the selected state of the selecting area between the first state and the second state based on the received switch signal after the switch receiving module 362 receives the switch signal.

According to an embodiment of the present disclosure, the first volume adjusting interface displayed by the first display module 330 further includes a first triggering area. The volume adjusting apparatus further comprises a first trigger signal receiving module 372, a second display module 374, a second signal receiving module 375 and a second applying module 376. The first trigger signal receiving module 372 is configured to receive a first triggering signal corresponding to the first triggering area. The second display module 374 is configured to display a second volume adjusting interface based on the received first triggering signal after the first trigger signal receiving module 372 receives a first triggering signal, the second volume adjusting interface including a volume adjusting area corresponding to at least one other application scene. The second signal receiving module 375 is configured to receive a second volume adjusting signal for the volume adjusting area corresponding to at least one other application scene. The second applying module 376 is configured to adjust the volume based on the second volume adjusting signal and apply the adjusted volume to the other application scene.

According to an embodiment of the present disclosure, the volume adjusting apparatus further comprises a state determining module 392, a first setting module 394 and a second setting module 396. The state determining module 392 is configured to determine whether the selected state of the selecting area is in the second state. The first setting module 394 is configured to set the second volume adjusting interface in an uneditable state in case that the selected state of the selecting area is in the second state. The second setting module 396 is configured to set the second volume adjusting interface in an editable state in case that the selected state of the selecting area is in the first state.

According to an embodiment of the present disclosure, the second volume adjusting interface includes a second triggering area and the volume adjusting apparatus further comprises: a second trigger signal receiving module 382, a third display module 384, a third signal receiving module 385 and a third applying module 386. The second trigger signal receiving module 382 is configured to receive a second triggering signal corresponding to the second triggering area. The third display module 384 configured to display a third volume adjusting interface based on the received second triggering signal after the second trigger signal receiving module 382 receives a second triggering signal, the third volume adjusting interface including a volume adjusting area corresponding to at least one third-party application. The third signal receiving module 385 is configured to receive a third volume adjusting signal for the volume adjusting area corresponding to at least one third-party application. The third applying module 386 is configured to adjust the volume based on the third volume adjusting signal and applying the adjusted volume to the third-party application.

With the configuration of the volume adjusting apparatus mentioned above, the problem that the existing volume adjusting method can adjust only the global volumes is solved by displaying a first volume adjusting interface including an volume adjusting area corresponding to the current application scene and a selecting area and determining whether the adjusted volume is applied to all the application scenes or only the current application scene based on the selected state of the selecting area. Further, with the configuration mentioned above, automatically identifying the current application scene and selectively adjusting the volume of only the current application scene or all the application scenes simultaneously can be achieved.

In addition, the volume adjusting apparatus according to the present disclosure can selectively adjust the volume of both other application scene and an application scene of a third-party application simultaneously by providing the second volume adjusting interface and/or the third volume adjusting interface, so as to obtain an effect of adjusting the volume of different application scenes conveniently and promptly by several simple operation steps.

It shall be noted that the volume adjusting apparatus according to the embodiments described above are exemplified by being divided into the respective function modules mentioned above. However, in actual implementation, the functions mentioned above can be achieved by a different function module. That is, the configuration of the apparatus can be divided into different function modules to implement all or some of the functions mentioned above. In addition, the apparatus and the method for adjusting volume according to the embodiments belong to the same concept. Therefore, the specific implementing procedure of the apparatus may refer to those of the method embodiments. The description thereof is omitted herein.

Figure 5:
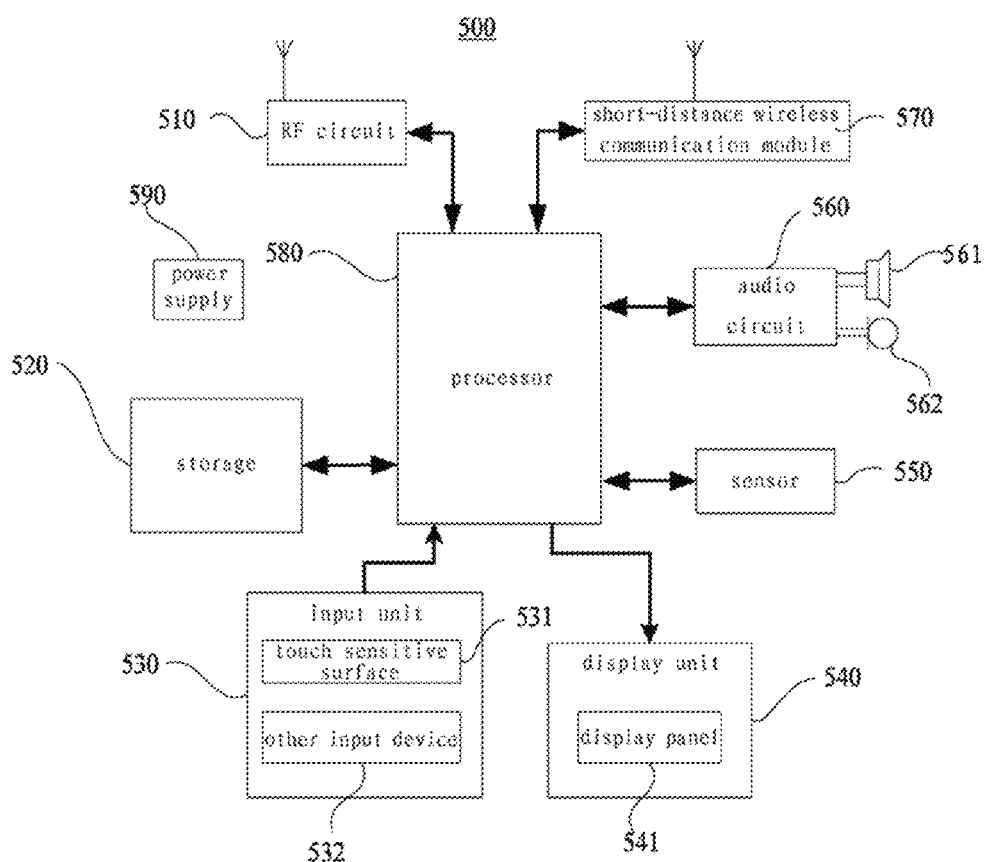
FIG. 5 is a structural schematic diagram that shows an electronic device according to a fifth embodiment of the present disclosure.

FIG. 5 is a structural schematic diagram that shows an electronic device according to a fifth embodiment of the present disclosure.

As shown in FIG. 5, it is a structural schematic diagram that shows an electronic device according to the fifth embodiment of the present disclosure. The electronic device is used to implement the volume adjusting method according to the embodiments described above.

As an embodiment, the electronic device 500 may comprises a RF circuit 510, a storage 520 including one or more computer-readable memory medium, an input unit 530, a display unit 540, a sensor 550, an audio circuit 560, a short-distance wireless communication module 570, a processor 580 including one or more processing cores, and a power supply 590 and so on. The person skilled in the art may conceive that the configuration of the electronic device as illustrated in FIG. 5 is not a limit and the electronic device may include more or less components, combine some components, or arrange the components in a different way.

Specifically, RF circuit 510 may be configured to transmit or receive a signal in transmitting or receiving message or calling. In particular, after receiving downstream information from a base station, the RF circuit 510 submits it to one or more processor 580 to process it. On the other hand, the RF circuit 510 transmits upstream data to the base station. In general, the RF circuit 510 includes, but not limited to, an antenna, at least one amplifier, a tuner, one or more oscillators, SIM card, transceiver, a coupler, a low noise amplifier (LNA), and diplexer and so on. In addition, the RF circuit 510 may further communicate with other device by a wireless communication and network. The wireless communication may adopt any communication standard or protocol including, but not limited to, Global System of Mobile communication (GSM), General Packet Radio Service (GPRS), Code Division Multiple Access (CDMA), Wideband Code Division Multiple Access (WCDMA), Long Term Evolution (LTE), email, Short Messaging Service (SMS) and so on.

The storage 520 may be used to store software program and module. The processor 580 may execute a variety of functional applications and process data by running the software program and module stored in the storage 520. The storage 520 mainly includes a program storage area and a data storage area. The program storage area may store an operation system and an application program required by at least a function such as an audio playing function, video playing function or the like. The data storage area may store the data such as audio data or phone book, which are created by using the electronic device 500. Further, the storage 520 may be a RAM, a non-transitory memory such as a magnetic disk storage device, a flash memory or other non-volatile memory. Correspondingly, the storage 520 may include a memory controller which provides the processor 580 and the input unit 530 with an access to the storage 520.

The input unit 530 may be used to receive digital or character information to be inputted and produce an information input associated with a user setting and a function control by a keyboard, a mouse, a joy stick, optical or track ball. Specifically, the input unit 530 may include a touch sensitive surface 531 and other input device 532. The touch sensitive surface 531, also referred to as a touch screen or a touch control panel, may collect touch operations of the user applied to the screen or near the screen, such as the operations on or near the touch sensitive surface 531 applied by the user using any suitable subject or attachments including a finger and a touch pen, and drive a corresponding linked device based on a preset program. Alternatively, the touch sensitive surface 531 may include two portions of a touch detection device and a touch controller. The touch detection device is configured to detect a touch orientation of the user and a signal generated by the touch operation and to transmit the detected signal to the touch controller. The touch controller receives the touch signal from the touch detection device, transfers the received signal into the coordinate of the touch point and then transmits the transferred coordinate to the processor 580, and receives and executes an instruction from the processor 580. In addition, the touch sensitive surface 531 can be implemented in a variety of types such as resistance-type, capacitance-type, infrared-type, or surface acoustic wave type and so on. Besides the touch sensitive surface 531, the input unit 530 further includes other input device 532. Specifically, the other input device 532 may include but not limited to one or more of a physical keyboard, a function keyboard such as a volume control push-key and a switch push-key or the like, a trick ball, a mouse and a joystick and so on.

The display unit 540 may be used to show information inputted by or outputted to the user and a variety of graphical user interface (GUI) of the electronic device 500. The GUI may be configured by graph, text, icon, video and any combination thereof. The display unit 540 may include a display panel 541. Optionally, the display panel 541 can be configured in a form of a Liquid Crystal Display (LCD), or an Organic Light-Emitting Diode (OLED). Further, the touch sensitive surface 531 overlays on the display panel 541. After the touch sensitive surface 531 detects a touch operation on or near the surface, the detected touch operation is transmitted to the processor 580 to determine the type of the touch event. Subsequently, the processor 580 provides a vision output in the display panel 541 based on the type of the touch event. Although, in FIG. 5, the touch sensitive surface 531 and the display panel 541 are implemented in two independent components, they may be integrated with each other in other embodiments so as to achieve an input-output function.

The electronic device 500 further includes at least one sensor 550 such as an optical sensor, a motion sensor and other sensor. Specifically, the optical sensor may include an ambient light sensor and a proximity sensor. The ambient light sensor may adjust the brightness of the display panel 541 based on the strength of the ambient light. The proximity sensor may turn off the display panel 541 and/or the backlight when the electronic device 500 approaches to the ear. As a type of motion sensor, a gravitation sensor (G-sensor) can detect the acceleration of each direction (in general, three axis directions) and detect the gravity and its direction.

The detection result of the sensor may be used to an application for identifying the posture of a cell phone, such as an application of a panel switch between a transverse direction and a longitudinal direction mutually, an associated games and a magnetometer posture calibration, and to an associated function for identifying a vibration, such as a function of a step counter or a tap counter. As for the electronic device 500, it may be provided with other sensor such as gyroscope, barometer, hygrometer, thermometer, infrared sensor and so on, the description that relates to them is omitted.

The audio circuit 560, a speaker 561 and a microphone 562 may provide an interface between the user and the electronic device 500. The audio circuit 560 can transmit the electric signal converted from a received audio data to the speaker 561 so as to convert the electric signal into sound signal and then output it. On the other hand, the microphone 562 collects sound signal and convert them into electric signal. The audio circuit 560 receives the electric signal, converts the received electric signal into audio data, and then transmits the audio data to the processor 580. After being processed by the processor 580, the audio data is transmitted to another terminal or outputted to the storage 520 to be processed in future. The audio circuit 560 further includes an earphone socket for communication between an external earphone and the electronic device 500.

The short-distance wireless communication module 570 may be a wireless fidelity (WiFi) module, a blue-tooth module or the like. The electronic device 500 may help the user receive or send email, view webpage and access streaming media by means of the short-distance wireless communication module 570. Further, the electronic device 500 may further provide the user with a wireless broad-band internet access by means of the short-distance wireless communication module 570. Although the short-distance wireless communication module 570 is illustrated in FIG. 5, it shall be understood that the short-distance wireless communication module 570 is not a necessary component of the electronic device 500 and can be omitted without departing from the substantial scope of the present disclosure if needed.

The processor 580 is the control center of the electronic device 500, uses a variety of interfaces and wiring to connect all the components of the electronic device, invokes the data stored in the storage 520 by running or executing the software program and/or module stored in the storage 520 so as to perform the variety of function of the electronic device 500 and process the data, and monitors wholly the electronic device. Alternatively, the processor 580 may include one or more processing core. Preferably, the processor 580 may integrate an application processor and a modem. The application processor mainly processes the operation system, the user interface, the application program and so on. The modem mainly processes wireless communication. It shall be understood that the modem may not be integrated into the processor 580.

The electronic device 500 further comprises a power supply 590, such as a battery, which powers all the components. Preferably, the power supply may logically connect to the processor 580 through a power supply management system so as to achieve the functions of charging, discharging and power consumption management by the power supply management system. The power supply 590 further includes one or more DC or AC power supplies, rechargeable system, power supply fault detection circuit, power supply convertor or inverter, power supply state indicator and any combination thereof.

Although there is not shown, the electronic device 500 may include a camera, blue-tooth module and so on, whose description is omitted herein. In a specific embodiment, the display unit of the electronic device 500 may be a touch panel display.

The electronic device 500 further comprises storage and one or more programs. The one or more programs are stored in the storage and configured to be executed by one or more processors. The instructions contained in the one or more programs are used to execute a volume adjusting method. The volume adjusting method is the one as shown in FIG. 1 and the embodiments corresponding to FIG. 1, and/or the one as shown in FIG. 2A and the embodiments corresponding to FIG. 2A.

As another aspect, a still embodiment of the present disclosure provides a computer-readable memory medium. The computer-readable memory medium may be a computer-readable memory medium contained in the storage of the above embodiments, or a single one which is not installed in the electronic device or a server. The computer-readable memory medium has one or more programs. The one or more programs are executed by one or more processors to execute a volume adjusting method. The volume adjusting method is the one as shown in FIG. 1 and the embodiments corresponding to FIG. 1, and/or the one as shown in FIG. 2A and the embodiments corresponding to FIG. 2A.

As a still aspect, another embodiment of the present disclosure provides a graphical user interface (GUI). The GUI is used in an electronic device. The electronic device includes a touch panel display, a memory and one or more processors for executing one or more programs. The GUI is configured to receive a first volume adjusting signal; to detect a current application scene based on a display content of the electronic device after receiving the volume adjusting signal; to display a first volume adjusting interface, the first volume adjusting interface including an volume adjusting area which corresponds to the detected current application scene and a selecting area for indicating whether the volume adjusting signal is applied to all the application scenes of the electronic device; and to adjust volume based on the first volume adjusting signal and apply the adjusted volume to the detected current application scene in case that a selected state of the selecting area is in a first state that the volume adjusting signal is not applied to all the application scenes of the electronic device or adjusting volume based on the first volume adjusting signal and applying the adjusted volume to all the application scenes of the electronic device in case that a selected state of the selecting area is in a second state that the volume adjusting signal is applied to all the application scenes of the electronic device.

According to an embodiment of the present disclosure, the GUI is further configured to, after displaying the first volume adjusting interface, receive a switch signal corresponding to the selecting area; and to switch the selected state of the selecting area between the first state and the second state based on the received switch signal.

According to an embodiment of the present disclosure, the first volume adjusting interface includes a first triggering area and the GUI is further configured to receive a first triggering signal corresponding to the first triggering area; to display a second volume adjusting interface based on the received first triggering signal, the second volume adjusting interface including a volume adjusting area corresponding to at least one other application scene; to receive a second volume adjusting signal for the volume adjusting area corresponding to at least one other application scene; and to adjust the volume based on the second volume adjusting signal and apply the adjusted volume to the other application scene.

According to an embodiment of the present disclosure, the GUI is further configured to, before receiving the second volume adjusting signal for the volume adjusting area corresponding to at least one other application scene, to determine whether the selected state of the selecting area is in the second state; to set the second volume adjusting interface in an uneditable state in case that the selected state of the selecting area is in the second state; and to set the second volume adjusting interface in an editable state in case that the selected state of the selecting area is in the first state.

According to an embodiment of the present disclosure, the second volume adjusting interface further includes a second triggering area and the GUI is further configured to receive a second triggering signal corresponding to the second triggering area; to display a third volume adjusting interface based on the received second triggering signal, the third volume adjusting interface including a volume adjusting area corresponding to at least one third-party application; to receive a third volume adjusting signal for the volume adjusting area corresponding to at least one third-party application; and to adjust the volume based on the third volume adjusting signal and apply the adjusted volume to the third-party application.

The number of the above embodiments is only for description, does not indicate whether the embodiments are good or not.

The person skilled in the art can understand that the entire processes or part thereof described above may be implemented by hardware or by a computer program instructing relevant hardware. Said program may be stored in a computer-readable storage medium which may include a read-only memory (ROM), a magnetic disk, or a CD (compact disc) etc.

The descriptions of the various embodiments of the present disclosure have been presented only for purposes of illustration, but are not intended to be exhaustive or limited to the embodiments disclosed. Many modifications and variations will be apparent to those of ordinary skill in the art without departing from the scope of the described embodiments.

The invention claimed is:

1. A volume adjusting method used in an electronic device, comprising:
   receiving, by a signal receiving module using a processor, a first volume adjusting signal;
   detecting, by a scene detecting module using a processor, a current application scene based on a display content of the electronic device after receiving the volume adjusting signal;
   displaying, by a first display module using a processor, a first volume adjusting interface, the first volume adjusting interface including an volume adjusting area which corresponds to the detected current application scene and a selecting area for indicating whether the volume adjusting signal is applied to all the application scenes of the electronic device;
   adjusting, by a local applying module using a processor, volume based on the first volume adjusting signal and applying the adjusted volume to the detected current application scene in case that a selected state of the selecting area is in a first state that the volume adjusting signal is not applied to all the application scenes of the electronic device or adjusting, by a global applying module using a processor, volume based on the first volume adjusting signal and applying the adjusted volume to all the application scenes of the electronic device in case that a selected state of the selecting area is in a second state that the volume adjusting signal is applied to all the application scenes of the electronic device.

2. The volume adjusting method according to claim 1, further comprising: after displaying the first volume adjusting interface,
   receiving, by a switch receiving module using a processor, a switch signal corresponding to the selecting area; and
   switching, by a state switching module using a processor, the selected state of the selecting area between the first state and the second state based on the received switch signal.

3. The volume adjusting method according to claim 1, wherein the first volume adjusting interface includes a first triggering area and the method further comprising:
   receiving, by a first trigger signal receiving module using a processor, a first triggering signal corresponding to the first triggering area;
   displaying, by a second display module using a processor, a second volume adjusting interface based on the received first triggering signal, the second volume adjusting interface including a volume adjusting area corresponding to at least one other application scene;
   receiving, by a second signal receiving module using a processor, a second volume adjusting signal for the volume adjusting area corresponding to at least one other application scene; and
   adjusting, by a second applying module using a processor, the volume based on the second volume adjusting signal and applying the adjusted volume to the other application scene.

4. The volume adjusting method according to claim 3, further comprising: before receiving the second volume adjusting signal for the volume adjusting area corresponding to at least one other application scene,
   determining, by a state determining module using a processor, whether the selected state of the selecting area is in the second state;
   setting, by a first setting module using a processor, the second volume adjusting interface in an uneditable state in case that the selected state of the selecting area is in the second state; and
   setting, by a second setting module using a processor, the second volume adjusting interface in an editable state in case that the selected state of the selecting area is in the first state.

5. The volume adjusting method according to claim 3, wherein the second volume adjusting interface further includes a second triggering area and the method further comprising:
   receiving, by a second trigger signal receiving module using a processor, a second triggering signal corresponding to the second triggering area;
   displaying, by a third display module using a processor, a third volume adjusting interface based on the received second triggering signal, the third volume adjusting interface including a volume adjusting area corresponding to at least one third-party application;
   receiving, by a third signal receiving module using a processor, a third volume adjusting signal for the volume adjusting area corresponding to at least one third-party application; and adjusting, by a third applying module using a processor, the volume based on the third volume adjusting signal and applying the adjusted volume to the third-party application.

6. A volume adjusting apparatus in an electronic device, comprising:

one or more processors;

a memory for storing computer program instructions, the computer program instructions, when being executed by at least one of the processors, perform the processes of:

receiving a first volume adjusting signal;

detecting a current application scene based on a display content of the electronic device after receiving the volume adjusting signal;

displaying a first volume adjusting interface, the first volume adjusting interface including an volume adjusting area which corresponds to the detected current application scene and a selecting area for indicating whether the volume adjusting signal is applied to all the application scenes of the electronic device;

adjusting volume based on the volume adjusting signal and apply the adjusted volume to the detected current application scene in case that a selected state of the selecting area is in a first state that the volume adjusting signal is not applied to all the application scenes of the electronic device; and adjusting volume based on the volume adjusting signal and apply the adjusted volume to all the application scenes of the electronic device in case that a selected state of the selecting area is in a second state that the volume adjusting signal is applied to all the application scenes of the electronic device.

7. The volume adjusting apparatus according to claim 6, wherein the computer program instructions, when being executed by at least one of the processors, further perform the processes of:

receiving a switch signal corresponding to the selecting area; and switching the selected state of the selecting area between the first state and the second state based on the received switch signal.

8. The volume adjusting apparatus according to claim 6, wherein the first volume adjusting interface includes a first triggering area and the computer program instructions, when being executed by at least one of the processors, further perform the processes of:

receiving a first triggering signal corresponding to the first triggering area;

displaying a second volume adjusting interface based on the received first triggering signal, the second volume adjusting interface including a volume adjusting area corresponding to at least one other application scene;

receiving a second volume adjusting signal for the volume adjusting area corresponding to at least one other application scene; and adjusting the volume based on the second volume adjusting signal and apply the adjusted volume to the other application scene.

9. The volume adjusting apparatus according to claim 8, wherein the computer program instructions, when being executed by at least one of the processors, further perform the processes of:

determining whether the selected state of the selecting area is in the second state;

setting the second volume adjusting interface in an uneditable state in case that the selected state of the selecting area is in the second state; and setting the second volume adjusting interface in an editable state in case that the selected state of the selecting area is in the first state.

10. The volume adjusting apparatus according to claim 8, wherein the second volume adjusting interface includes a second triggering area and the computer program instructions, when being executed by at least one of the processors, further perform the processes of:

receiving a second triggering signal corresponding to the second triggering area;

displaying a third volume adjusting interface based on the received second triggering signal, the third volume adjusting interface including a volume adjusting area corresponding to at least one third-party application;

receiving a third volume adjusting signal for the volume adjusting area corresponding to at least one third-party application; and adjusting the volume based on the third volume adjusting signal and applying the adjusted volume to the third-party application.

11. An electronic device comprising the apparatus for selecting content according to claim 6.

* * * * *